United States Patent
Leobandung

(10) Patent No.: US 9,472,654 B2
(45) Date of Patent: Oct. 18, 2016

(54) FORMING LOW PARASITIC TRIM GATE LAST MOSFET

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/662,521

(22) Filed: Mar. 19, 2015

(65) Prior Publication Data

US 2016/0276466 A1 Sep. 22, 2016

(51) Int. Cl.

| | |
|---|---|
| H01L 29/66 | (2006.01) |
| H01L 29/78 | (2006.01) |
| H01L 29/417 | (2006.01) |
| H01L 29/423 | (2006.01) |
| H01L 29/51 | (2006.01) |
| H01L 21/28 | (2006.01) |
| H01L 21/8234 | (2006.01) |

(52) U.S. Cl.
CPC ... *H01L 29/66795* (2013.01); *H01L 21/28017* (2013.01); *H01L 21/823431* (2013.01); *H01L 29/41791* (2013.01); *H01L 29/42364* (2013.01); *H01L 29/51* (2013.01); *H01L 29/66545* (2013.01); *H01L 29/785* (2013.01)

(58) Field of Classification Search
CPC .............. H01L 21/02109; H01L 21/8232
See application file for complete search history.

(56) References Cited

U.S. PATENT DOCUMENTS

| | | | |
|---|---|---|---|
| 7,084,025 B2 | 8/2006 | Phua et al. | |
| 8,039,388 B1 | 10/2011 | Ng et al. | |
| 8,343,867 B2 | 1/2013 | Ng et al. | |
| 8,502,325 B2 | 8/2013 | Chang et al. | |
| 8,735,236 B2 | 5/2014 | Hempel et al. | |
| 8,809,962 B2 | 8/2014 | Liu et al. | |
| 9,202,920 B1 * | 12/2015 | Liu | H01L 29/785 |
| 2010/0327376 A1 | 12/2010 | Chang et al. | |
| 2012/0319205 A1 | 12/2012 | Hempel et al. | |

* cited by examiner

*Primary Examiner* — Cheung Lee

(74) *Attorney, Agent, or Firm* — Fusheng Xu; Stephen R. Yoder

(57) ABSTRACT

A method for making a fin MOSFET with substantially reduced parasitic capacitance and/or resistance is provided. The fin MOSFET includes: a patterned fin structure on a substrate, the substrate including a first semiconductor layer; an epitaxy layer covering the substrate and a first portion of the fin structure, the first portion of the fin structure being doped to be integrated with the epitaxy layer, wherein a source and drain region is formed in the epitaxy layer; a metal gate high-k structure covering a second portion of the fin structure; a nitride structure covering the metal gate high-k structure; an oxide spacer structure enclosing the metal gate high-k structure and the nitride structure; and a metal contact structure for the source and drain region.

16 Claims, 13 Drawing Sheets

FORMING LOW PARASITIC TRIM GATE LAST MOSFET

BACKGROUND

The present invention relates generally to the field of semiconductor manufacturing, and more particularly to a method for forming low parasitic trim gate last MOSFET (metal oxide semiconductor field effect transistor).

A MOSFET is a semiconductor device which is widely used for switching and amplifying electronic signals in the electronic devices. The MOSFET is a core of integrated circuit and can be designed and fabricated in a single chip due to very small sizes. The MOSFET is a four terminal device with source(S), gate (G), drain (D) and body (B) terminals. The body of the MOSFET is frequently connected to the source terminal so making it a three terminal device like field effect transistor. The MOSFET can be used in both analog and digital circuits.

As one of approaches fabricating the MOSFET, gate-last metal-gate/high-k technology (also called RMG, replacement metal gate) allows for MOSFET scaling to unprecedented levels. The terminology "last" refers to a metal electrode is deposited after the high temperature activation anneal(s) of a fabrication flow. For example, a hafnium dielectric is deposited early on in the fabrication flow, prior to when a sacrificial polysilicon gate is created. After the high-temperature S-D (source-drain) and silicide annealing cycles, the dummy gate (i.e., the sacrificial polysilicon gate) is removed and metal gate electrodes are deposited last.

SUMMARY

According to an aspect of the present invention, there is a method for fabricating a fin MOSFET with substantially reduced parasitic capacitance and/or resistance, the method comprising patterning a fin structure on a substrate, the substrate including a first semiconductor layer; patterning a dummy gate structure covering a first portion of the fin structure; growing an epitaxy layer covering the substrate and a second portion of the fin structure, the second portion of the fin structure not being covered with the dummy gate structure and the second portion of the fin structure being doped to be integrated with the epitaxy layer, wherein a source and drain region is formed in the epitaxy layer; depositing an oxide layer covering the epitaxy layer, a topmost surface of the oxide layer being planarized to be level with a topmost surface of the dummy gate structure; removing the dummy gate structure to form a gate trench structure; undercutting the epitaxy layer under the oxide layer along sidewalls of the gate trench structure to form an undercut structure; forming a metal gate high-k structure by filling the undercut structure and a remaining portion of the gate trench structure with a high-k dielectric material and a metal gate material, a first portion of the metal gate high-k structure that fills the remaining portion of the gate trench structure being removed to form a nitride structure in the remaining portion of the gate trench structure; removing the oxide layer to expose the metal gate high-k structure and the epitaxy layer; removing a second portion of the metal gate high-k structure, the second portion of the metal gate high-k structure being not directly under the nitride structure; forming an oxide spacer structure by depositing an oxide material into a void formed by removal of the second portion of the metal gate high-k structure; and forming a metal contact structure for the source and drain region.

DETAILED DESCRIPTION

A major impediment to high performance of scaled devices, such as MOSFETs, is parasitic capacitance. For example, in conventional devices employing a replacement metal gate (RMG) electrode for improved drive current, a high parasitic capacitance is generated by virtue of a trench silicide between replacement metal gates. Typically, a high-k layer, such as a layer having a dielectric constant of at least 15, with 1 being the dielectric constant of a vacuum, is formed on the side surfaces of the replacement metal gate and on a silicon nitride spacer, having a dielectric constant of 7. Such devices are particularly hindered by the formation of a high parasitic capacitance. When the gate length is small, the dominant capacitance in the MOSFET is the gate to contact-plug capacitance.

Some embodiments of the present invention provide a method for fabricating a MOSFET having significantly reduced parasitic capacitance and/or resistance. In such embodiments, gate last approach is employed by making a dummy gate, making the rest of the transistor and then removing the dummy material and replacing it with the true gate materials, using different material mixes. A portion of high-k dielectric material and work function metal which is the source of parasitic resistance and capacitance are removed by trimming the gate last to allow low parasitic capacitance without a conventional spacer process.

Reference will now be made in detail to some embodiments of the present invention, examples of which are illustrated in the accompanying figures. Wherever possible, the same reference numbers will be used throughout the figures to refer to the same or like parts.

Figure 1A:
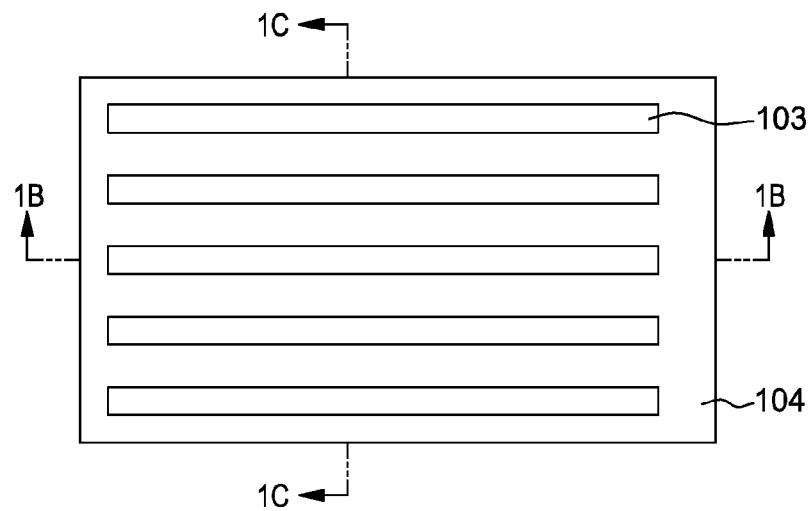
FIGS. 1A, 1B, and 1C illustrate an exemplary first step for fabricating a fin MOSFET with substantially reduced parasitic capacitance and/or resistance according to an embodiment of the present disclosure: forming a fin pattern on a substrate.
Figure 1B:
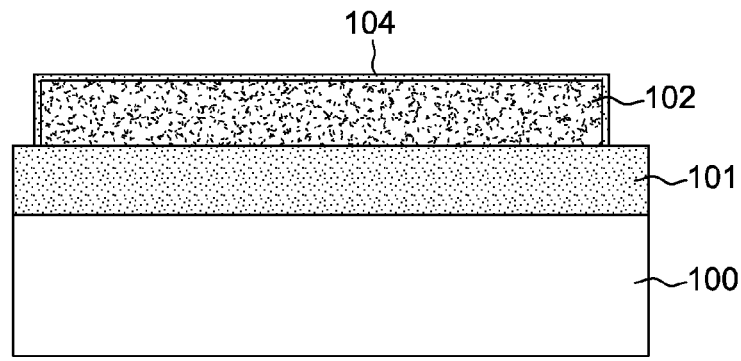
Figure 1C:
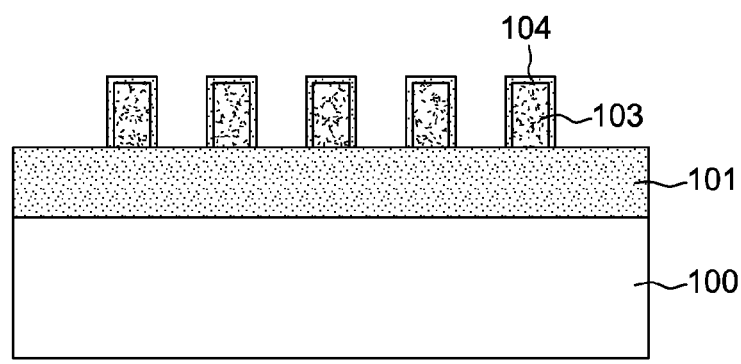

Referring to FIGS. 1A, 1B, and 1C, illustrated is an exemplary first step for making a fin MOSFET with substantially reduced parasitic capacitance and/or resistance according to an embodiment of the present disclosure. In this step, as shown in FIG. 1B, a substrate is provided including a first silicon layer 100, a buried oxide layer 101 (e.g., silicon oxide), and a second silicon layer 102. The second layer 102 can be any semiconductor such as Si, III-V, and II-IV material. The substrate can be a layered silicon-insulator-silicon substrate (also referred to as silicon-on-insulator (SOI)) to reduce parasitic device capacitance, thereby improving performance. Although SOI wafer is used as a preferred embodiment, the starting wafer (i.e., the substrate) can also be a bulk wafer with no buried insulator layer 101. The buried oxide layer 101 can be made of silicon dioxide and/or sapphire (also called silicon on sapphire (SOS)). A fin structure 103 with a fin height of about 30 nm, as shown in FIGS. 1A and 1C, is patterned out of the second silicon layer 102. Patterning of the fin structure 103 can be performed by any suitable approach including etching, spacer lithography, and/or sidewall image transfer. Alternatively, the fin structure 103 can be covered with a thin oxide layer 104 with a thickness ranging from about 1 nm to about 2 nm, as shown in FIG. 1C. The thin oxide layer 104 can be made of the same material as or different material from the buried oxide 101.

Figure 2A:
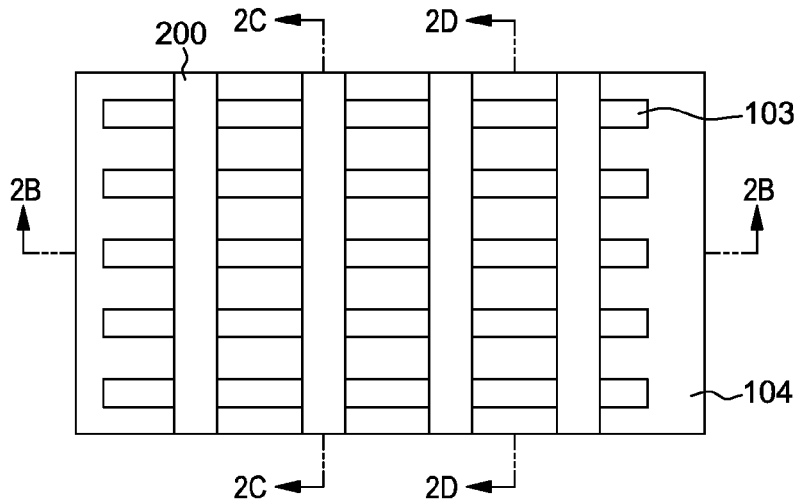
FIGS. 2A, 2B, 2C, and 2D illustrate an exemplary second step for fabricating a fin MOSFET with substantially reduced parasitic capacitance and/or resistance according to an embodiment of the present disclosure: patterning a dummy gate structure.
Figure 2B:
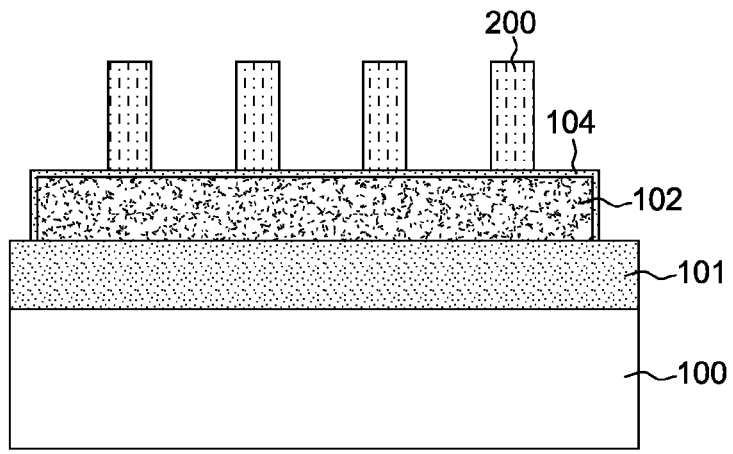
Figure 2C:
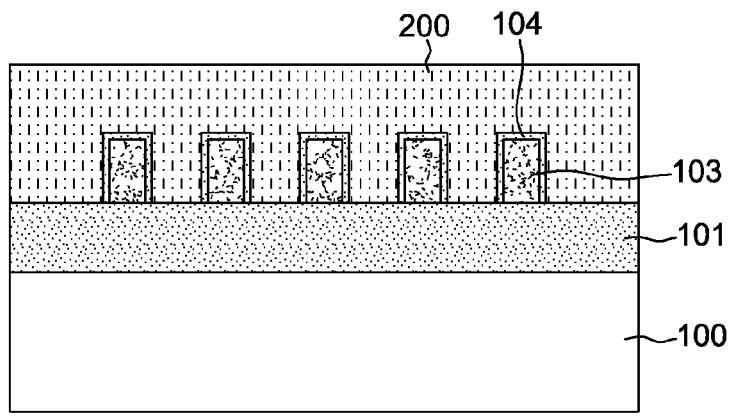
Figure 2D:
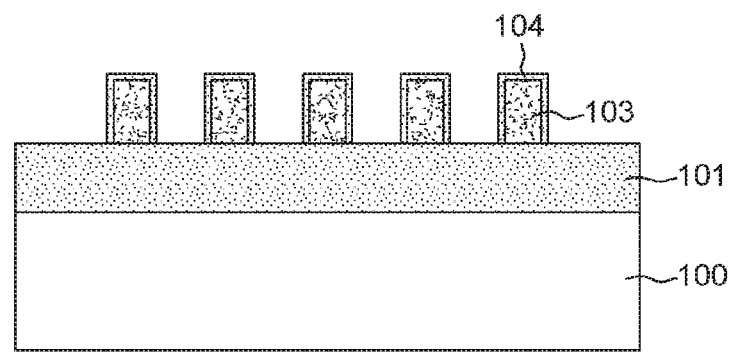

Referring to FIGS. 2A, 2B, 2C, and 2D, illustrated is an exemplary second step for making a fin MOSFET with substantially reduced parasitic capacitance and/or resistance according to an embodiment of the present disclosure. In this step, a dummy gate structure 200 is patterned covering a portion of the fin structure 103 and a portion of the buried oxide layer 101, as shown in FIGS. 2A, 2B and 2C. The dummy gate structure 200 can be formed by any suitable approach including deposition, etching (e.g., wet etching or dry etching), masking, and/or photolithography. For example, the dummy gate structure 200 can formed by depositing a dielectric layer, forming a mask over the dielectric layer, and patterning the dielectric layer. The dummy gate structure can be made of any insulator such as silicon nitride or silicon dioxide. In this exemplary embodiment, the dummy gate structure 200 is made of nitride having a gate height of about 50 nm.

Figure 3A:
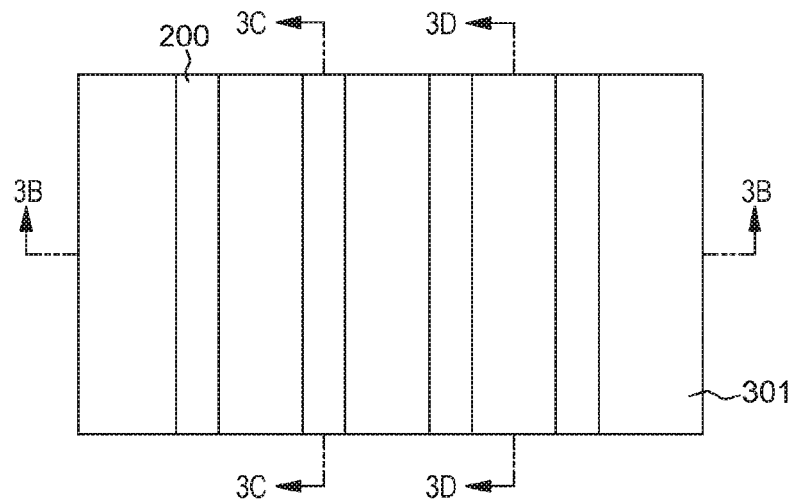
FIGS. 3A, 3B, 3C, and 3D illustrate an exemplary third step for fabricating a fin MOSFET with substantially reduced parasitic capacitance and/or resistance according to an embodiment of the present disclosure: growing an epitaxy layer covering the substrate and the fin pattern.
Figure 3B:
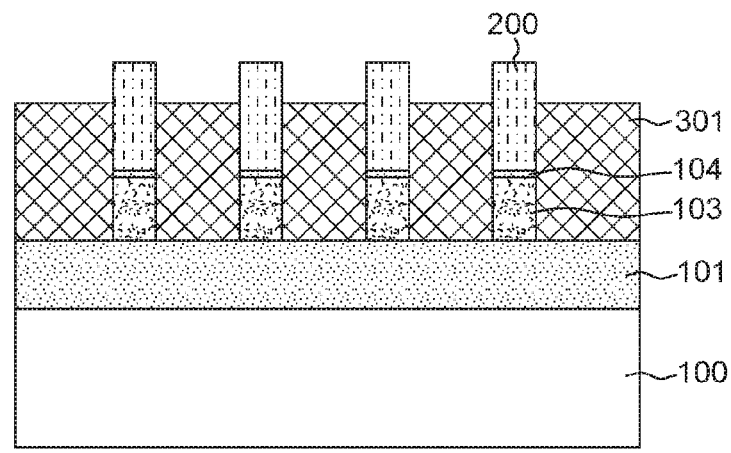
Figure 3C:
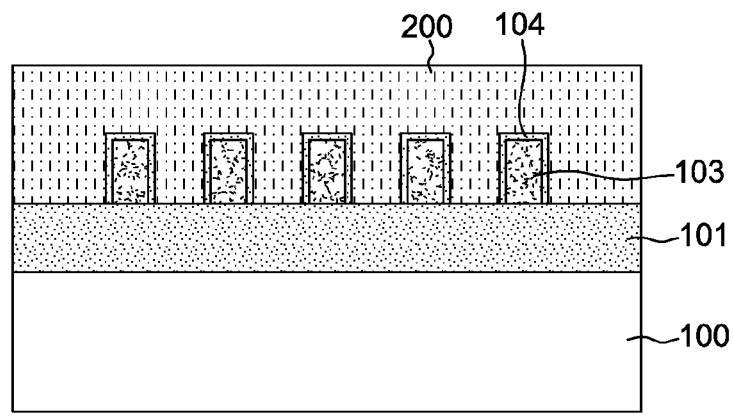
Figure 3D:
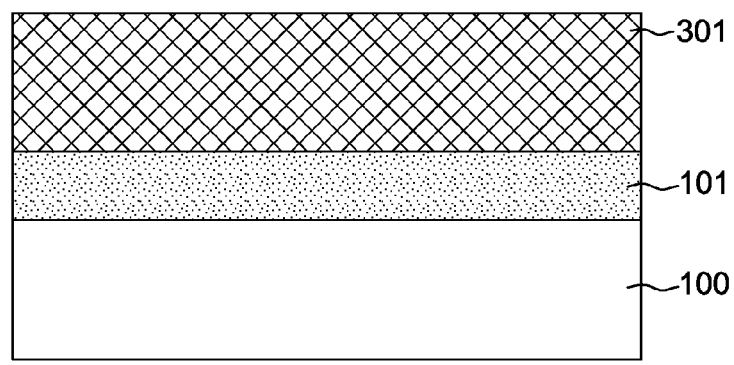

Referring to FIGS. 3A, 3B, 3C, and 3D, illustrated is an exemplary third step for making a fin MOSFET with substantially reduced parasitic capacitance and/or resistance according to an embodiment of the present disclosure. In this step, non-faceted selective epitaxial growth is performed covering a portion of the fin structure 103 and a portion of the buried oxide layer 101 to form a source/drain region 300, as depicted in FIGS. 3A, 3B, and 3D. No spacer is required as the dummy gate structure 200 is made of nitride. The epitaxial material can be the same or different from the material of the fin structure 103. For example, for a silicon device, the epitaxial material can be silicon-germanium (SiGe); for an indium gallium arsenide (InGaAs) channel device, the epitaxial material can be indium arsenide (InAs). The epitaxial growth can be conducted by employing any applicable process, for example, chemical vapor deposition (CVD), and/or atomic layer deposition (ALD). As shown in FIGS. 3B and 3D, the formed epitaxy layer 301 including the source/drain region 300 is a doped silicon layer having a thickness of about 10 nm the topmost surface of which is less than the topmost surface of the dummy gate structure 200. A high temperature annealing process is performed to drive implant into the fin structure 103, such that the portion of the fin structure 103 not covered by the dummy gate structure 200 becomes an integrated portion of the epitaxy layer 301, as shown in FIGS. 3B and 3C.

Figure 4A:
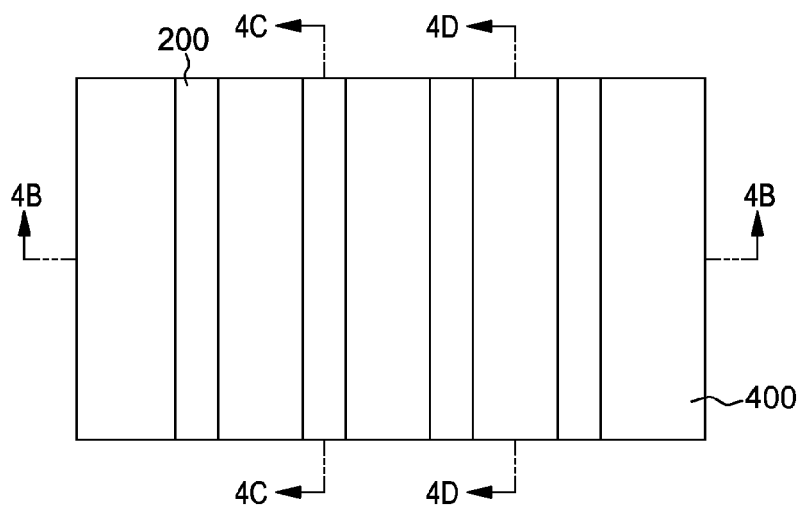
FIGS. 4A, 4B, 4C, and 4D illustrate an exemplary fourth step for fabricating a fin MOSFET with substantially reduced parasitic capacitance and/or resistance according to an embodiment of the present disclosure: depositing an oxide layer covering the epitaxy layer.
Figure 4B:
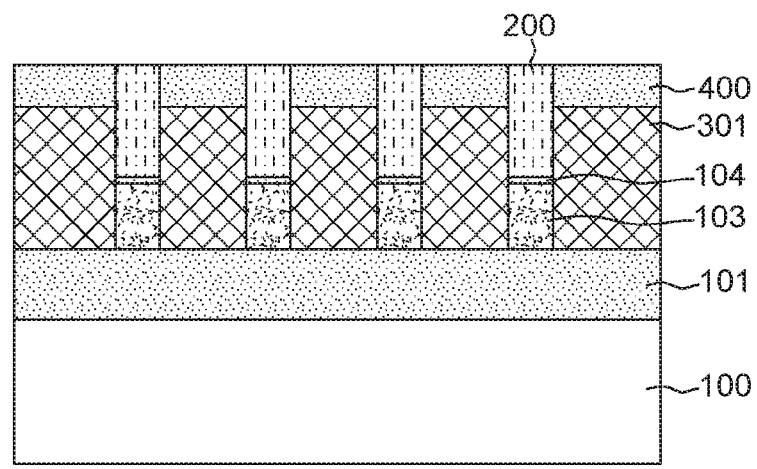
Figure 4C:
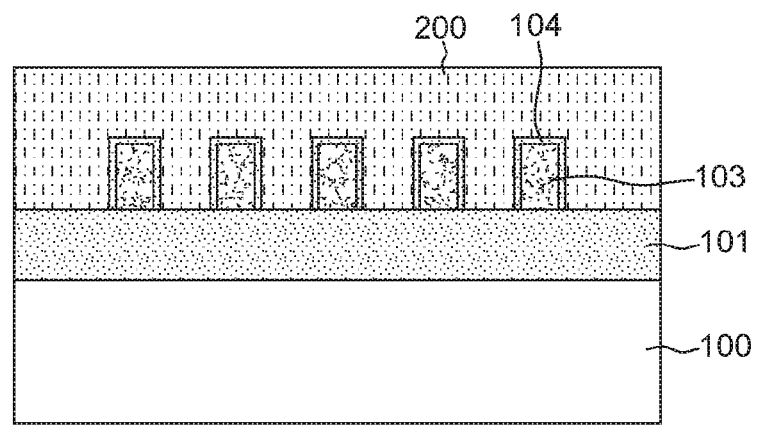
Figure 4D:
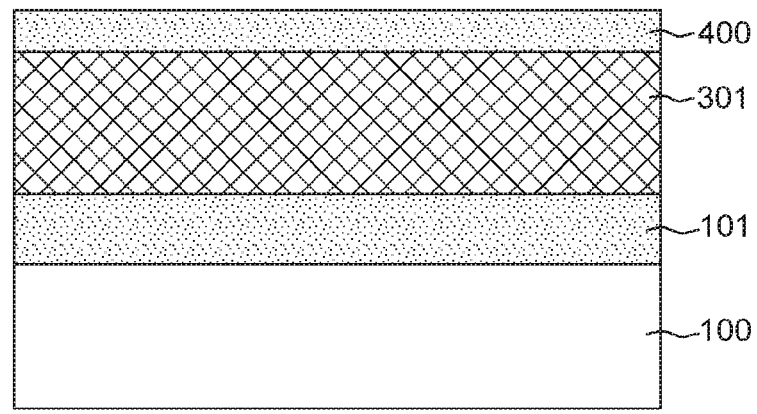

FIGS. 4A, 4B, 4C, and 4D, illustrated is an exemplary fourth step for making a fin MOSFET with substantially reduced parasitic capacitance and/or resistance according to an embodiment of the present disclosure. In this step, an oxide layer 400 is deposited covering the epitaxy layer 301/the source/drain region 300, as shown in FIGS. 4A, 4B, and 4D. The oxide layer 400 can be made of the same material as the buried oxide, and is deposited by, for example, chemical vapor deposition (e.g., ultrahigh vacuum CVD), and/or molecular layer deposition. A planarization process is followed to planarize the topmost surface of the oxide layer 400 such that the topmost surface of the oxide layer 400 is level with the topmost surface of the dummy gate structure 200, as shown in FIGS. 4B and 4D. The planarization process can be performed using, for example, chemical mechanical polishing.

Figure 5A:
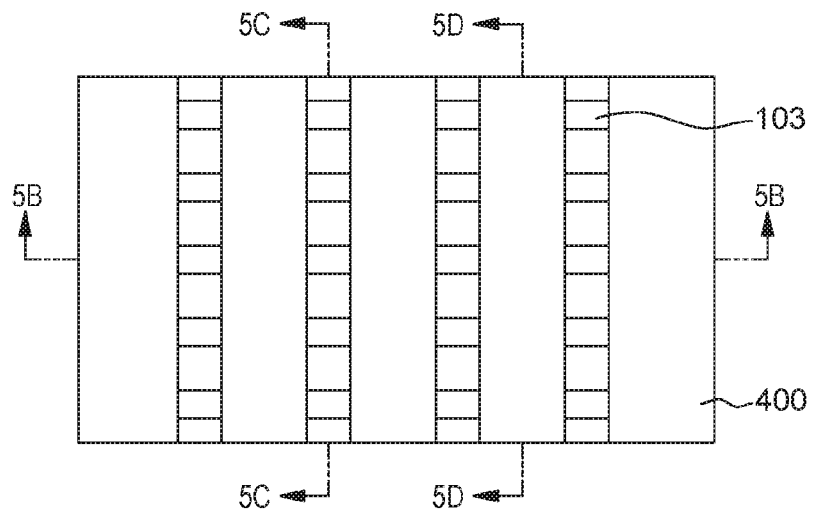
FIGS. 5A, 5B, 5C, and 5D illustrate an exemplary fifth step for fabricating a fin MOSFET with substantially reduced parasitic capacitance and/or resistance according to an embodiment of the present disclosure: removing the dummy gate structure.
Figure 5B:
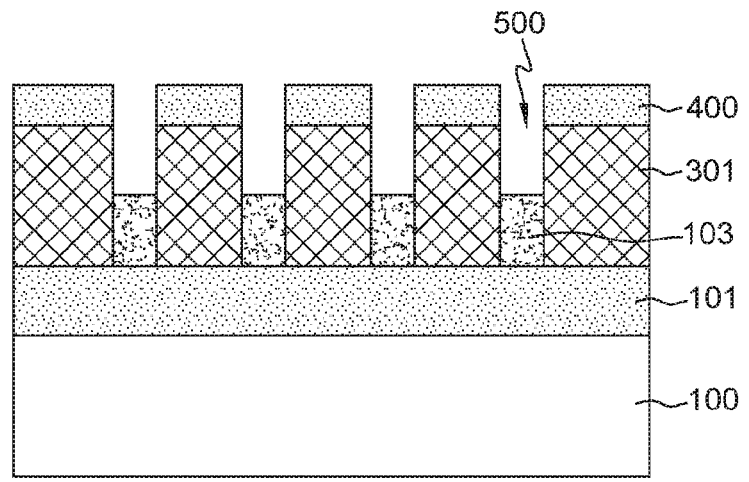
Figure 5C:
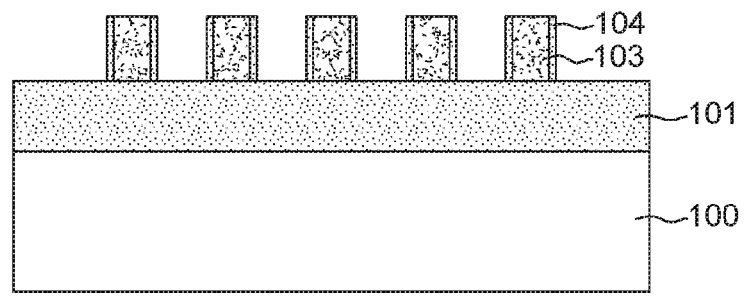
Figure 5D:
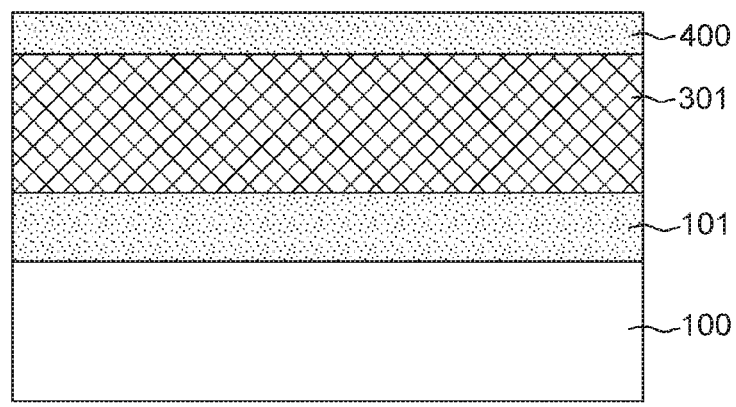

Referring to FIGS. 5A, 5B, 5C, and 5D, illustrated is an exemplary fifth step for making a fin MOSFET with substantially reduced parasitic capacitance and/or resistance according to an embodiment of the present disclosure. In this step, the dummy gate structure 200 is removed to expose the thin oxide layer 104 that covers the fin structure 103, as shown in FIGS. 5A to 5C. Alternatively, a portion of the thin oxide layer 104 directly under the dummy gate structure 200 is also removed. A gate trench structure 500 is formed by removal of the dummy gate structure 200. The removal of the dummy gate structure can be performed by any applicable approach such as wet etching, dry etching, and/or a combination thereof.

Figure 6A:
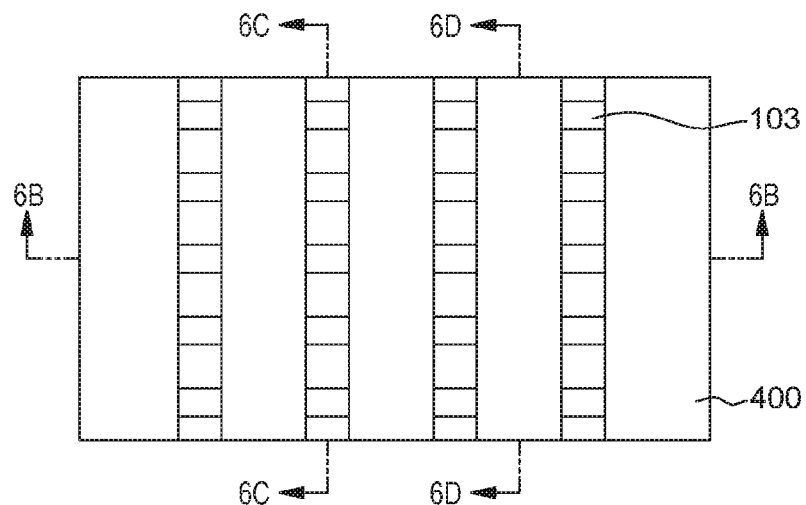
FIGS. 6A, 6B, 6C, and 6D illustrate an exemplary sixth step for fabricating a fin MOSFET with substantially reduced parasitic capacitance and/or resistance according to an embodiment of the present disclosure: undercutting the epitaxy layer under the oxide layer.
Figure 6B:
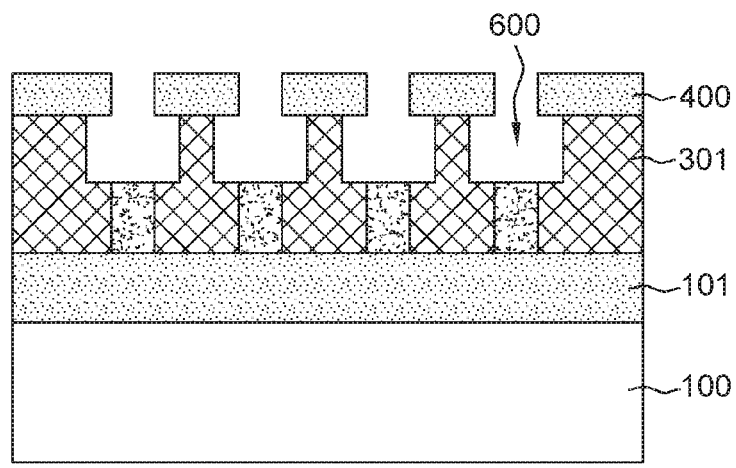
Figure 6C:
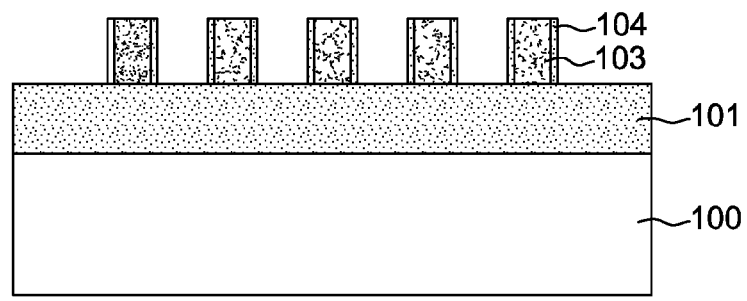
Figure 6D:
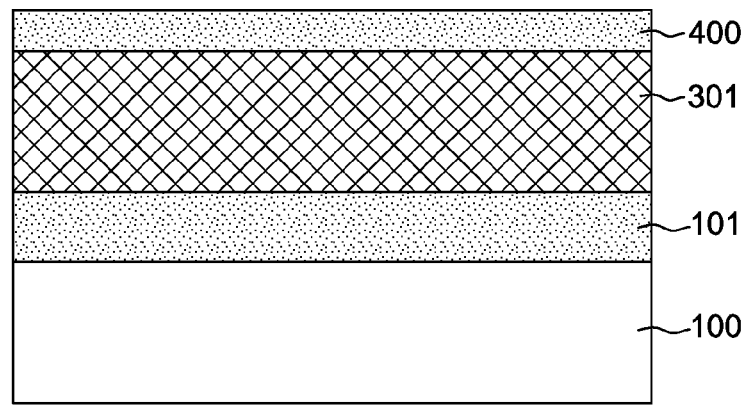

Referring to FIGS. 6A, 6B, 6C, and 6D, illustrated is an exemplary sixth step for making a fin MOSFET with substantially reduced parasitic capacitance and/or resistance according to an embodiment of the present disclosure. In this step, the doped epitaxy layer 301 along the sidewalls of the gate trench structure 500 is undercut to form an undercut structure 600, as shown in FIG. 6B. The width of the undercut structure 600 under the oxide layer 400 on each side of the gate trench structure 500 is about 10 nm, as shown in FIG. 6B. The undercut can be performed by any suitable approach, for example, wet etching and/or dry etching including selective etching and/or anisotropic etching.

Figure 7A:
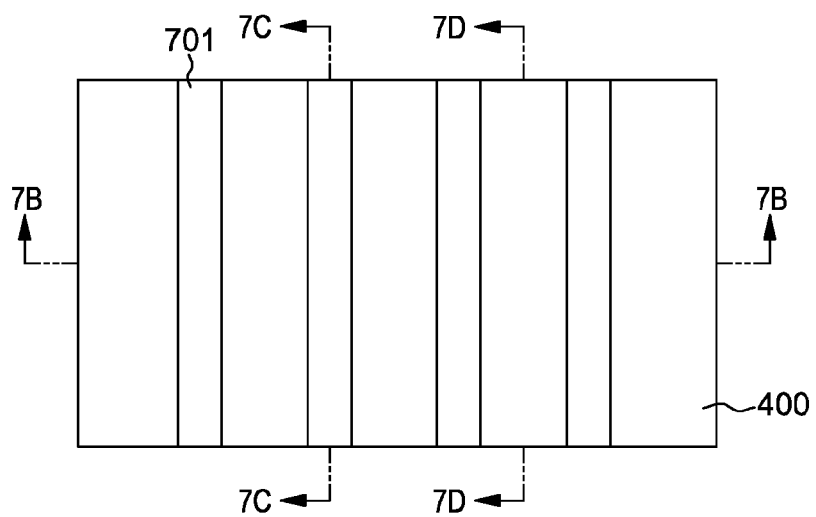
FIGS. 7A, 7B, 7C, and 7D illustrate an exemplary seventh step for fabricating a fin MOSFET with substantially reduced parasitic capacitance and/or resistance according to an embodiment of the present disclosure: forming a metal gate high-k structure and a nitride structure.
Figure 7B:
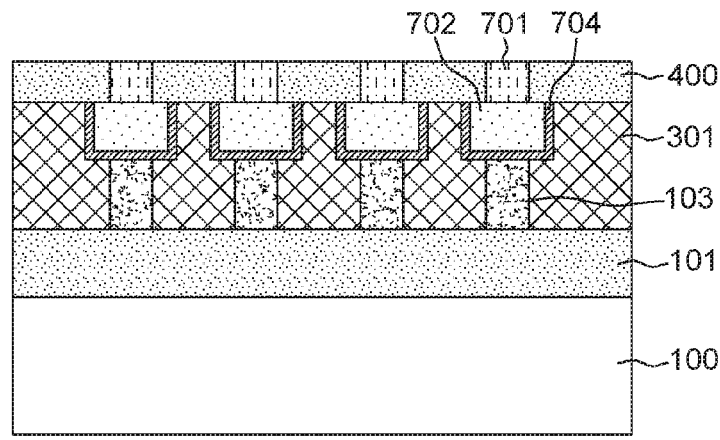
Figure 7C:
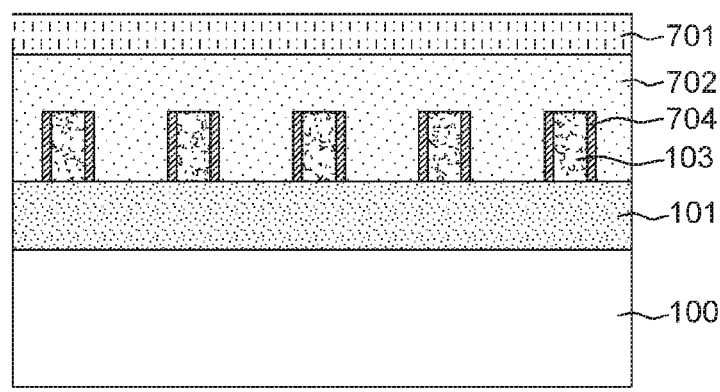
Figure 7D:
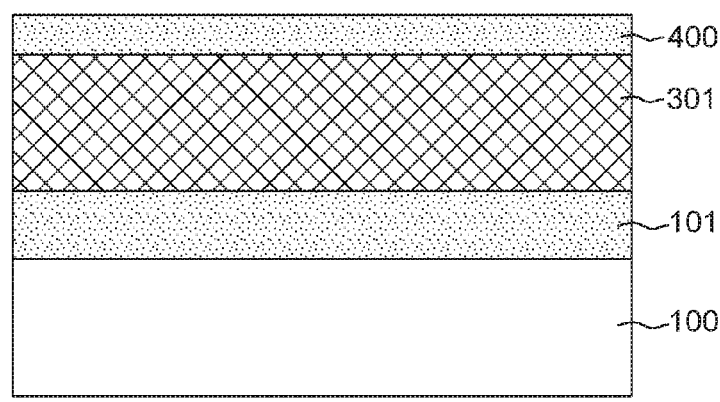

Referring to FIGS. 7A, 7B, 7C, and 7D, illustrated is an exemplary seventh step for making a fin MOSFET with substantially reduced parasitic capacitance and/or resistance according to an embodiment of the present disclosure. In this step, a high-k dielectric material and a metal gate material are filled to the undercut structure 600 to form a metal gate 702 and high-k structure 704, as shown FIGS. 7B and 7C. The high-k dielectric material and the metal gate material first fills both the undercut structure 600 and the remaining portion of the gate trench structure 500 completely. A planarization process is followed to make the topmost surface of the filling level with the topmost surface of the oxide layer 400. An etch back process is performed to remove the filling portion inside the remaining portion of the gate trench structure 500, after which, the remaining portion of the gate trench structure 500 is capped with a nitride structure 701, as shown in FIGS. 7B and 7C. The nitride structure 701 is then planarized to make the topmost surface of the nitride structure 701 level with the topmost surface of the oxide layer 400, as shown in FIGS. 7B and 7C. The filling of the high-k material and the metal gate material can be performed by any suitable approach, for example, chemical vapor deposition, atomic layer deposition, and/or sputtering. The high-k material includes but does not limit to hafnium silicon oxynitride (HfSiON), and the metal gate material includes but does not limit to titanium (Ta), titanium nitride (TaN), niobium (Nb), and/or tungsten nitride/ruthenium oxide (WN/RuO$_2$). The planarization process can be carried out by, for example, chemical mechanical polishing.

Figure 8A:
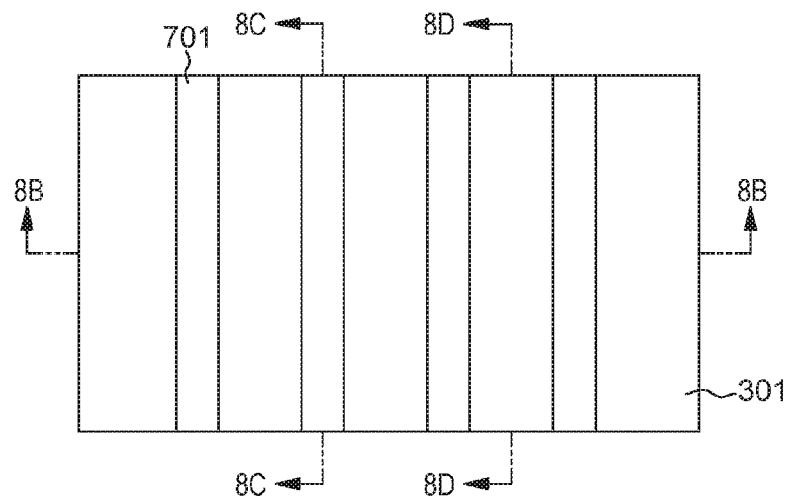
FIGS. 8A, 8B, 8C, and 8D illustrate an exemplary eighth step for fabricating a fin MOSFET with substantially reduced parasitic capacitance and/or resistance according to an embodiment of the present disclosure: removing the oxide layer.
Figure 8B:
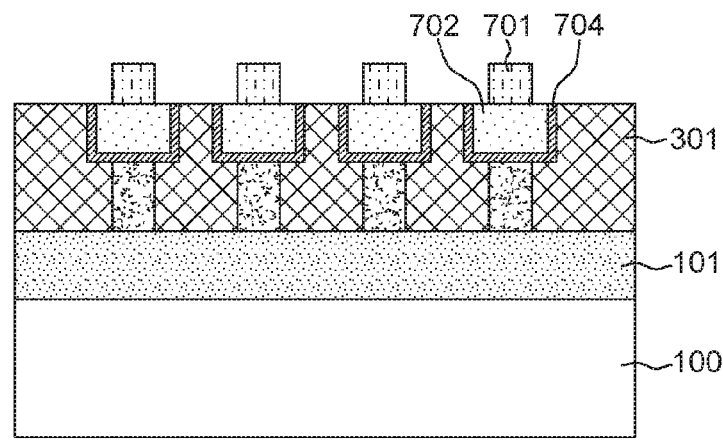
Figure 8C:
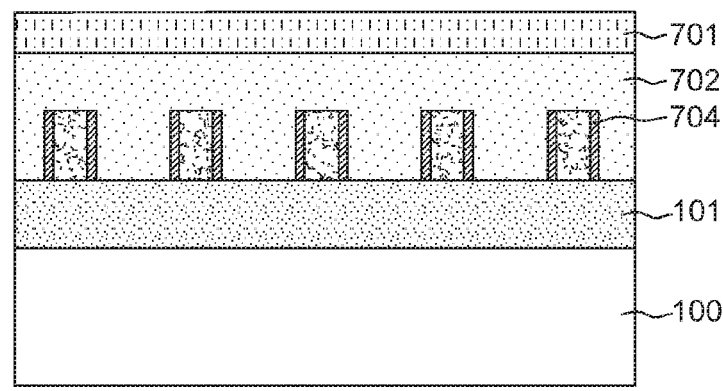
Figure 8D:
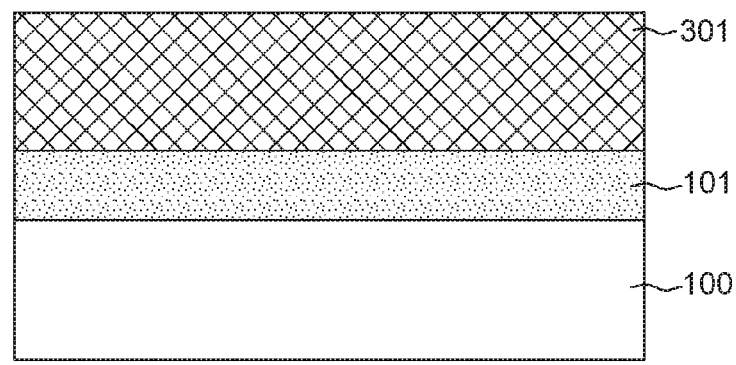

Referring to FIGS. 8A, 8B, 8C, and 8D, illustrated is an exemplary eighth step for making a fin MOSFET with substantially reduced parasitic capacitance and/or resistance according to an embodiment of the present disclosure. In this step, the oxide layer 400 is removed to expose the metal gate 702 and high-k structure 704, the nitride structure 701 and the doped epitaxy layer 301/the source/drain region 300, as shown in FIGS. 8B and 8D. The removal of the oxide layer 400 can be carried out by employing any suitable approach including wet etching, dry etching, and/or a combination thereof.

Figure 9A:
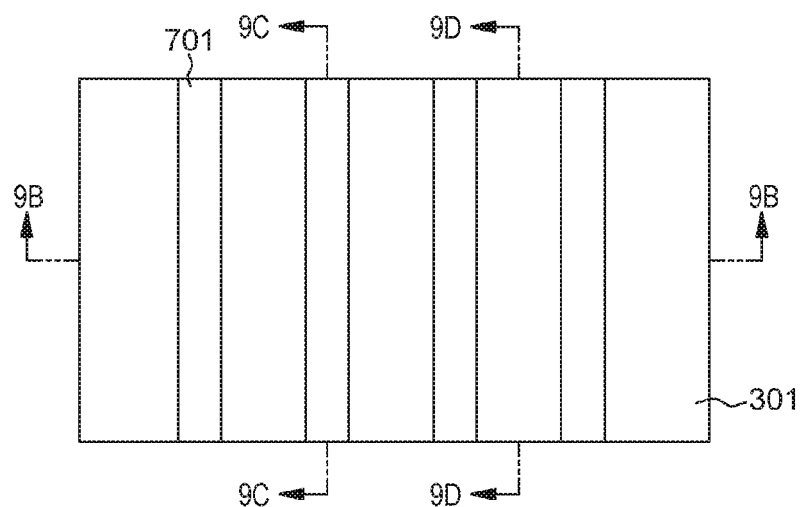
FIGS. 9A, 9B, 9C, and 9D illustrate an exemplary ninth step for fabricating a fin MOSFET with substantially reduced parasitic capacitance and/or resistance according to an embodiment of the present disclosure: removing a portion of the metal gate high-k structure being not directly under the nitride structure.
Figure 9B:
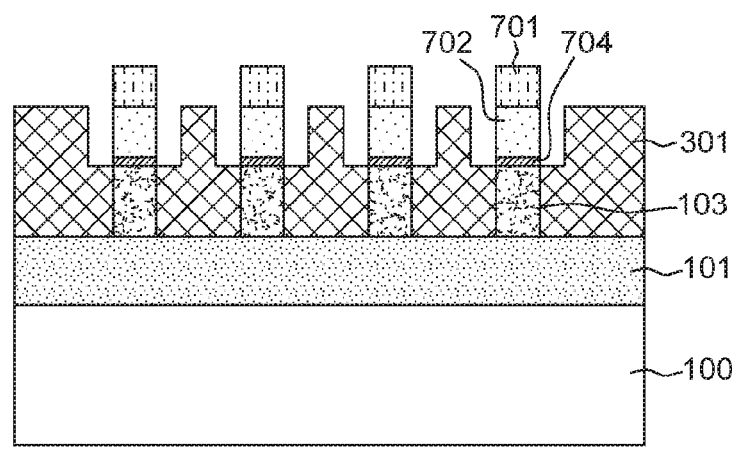
Figure 9C:
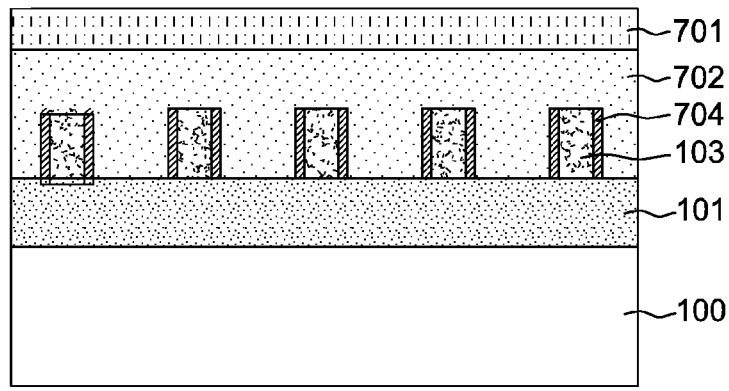
Figure 9D:
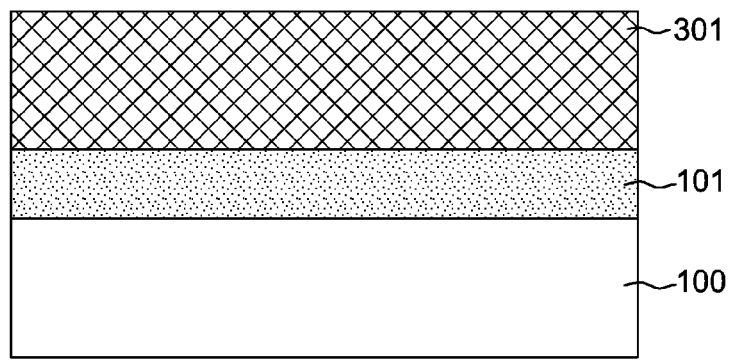

Referring to FIGS. 9A, 9B, 9C, and 9D, illustrated is an exemplary ninth step for making a fin MOSFET with substantially reduced parasitic capacitance and/or resistance according to an embodiment of the present disclosure. In this step, a portion of the metal gate 702 and a portion of high-k 704 are removed such that the remaining portion of the metal gate 702 and the remaining portion of the high-k 704 are directly under the nitride structure 701, as shown in FIG. 9B. The removal of the portion of the metal gate 702 and the portion of the high-k structure 704, selective to doped source drain 300, can be carried out by employing any suitable approach including wet etching, dry etching, and/or a combination thereof. Following the removal of the portion of the metal gate 702 and the portion of the high-k structure 704, hydrofluoric (HF) acid dipping is performed to remove the damaged high-k material of the high-k structure 704.

Figure 10A:
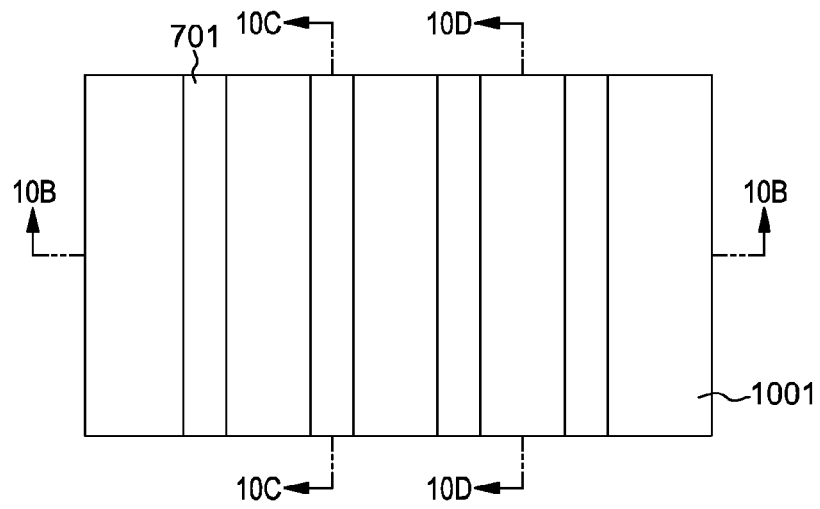
FIGS. 10A, 10B, 10C, and 10D illustrate an exemplary tenth step for fabricating a fin MOSFET with substantially reduced parasitic capacitance and/or resistance according to an embodiment of the present disclosure: forming an oxide spacer structure and a metal contact structure.
Figure 10B:
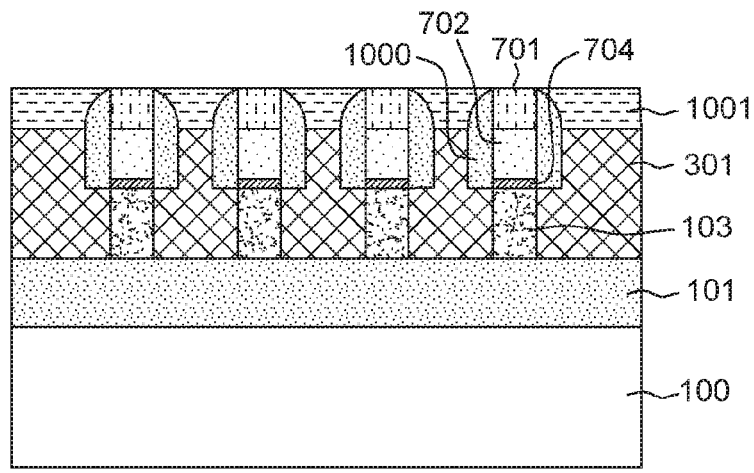
Figure 10C:
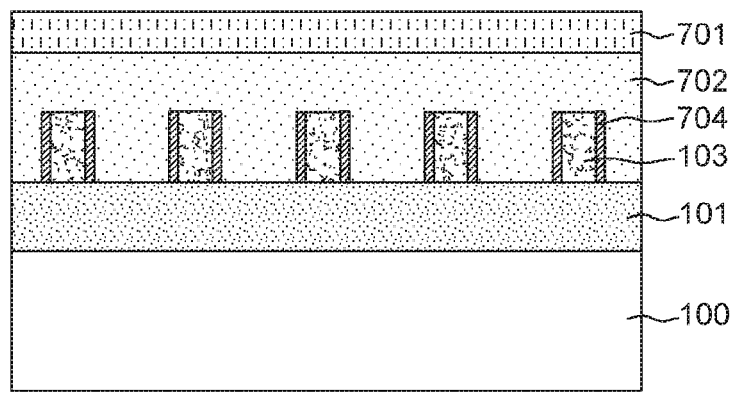
Figure 10D:
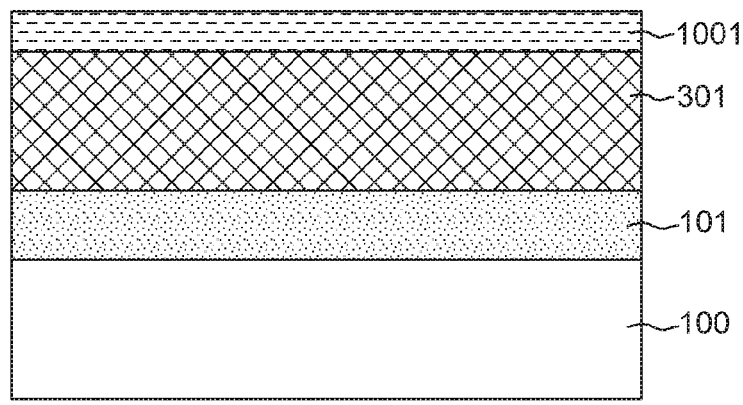

Referring to FIGS. 10A, 10B, 10C, and 10D, illustrated is an exemplary tenth step for making a fin MOSFET with substantially reduced parasitic capacitance and/or resistance according to an embodiment of the present disclosure. In this step, an oxide spacer structure 1000 is formed by depositing the oxide material into the void formed by removal of the portion of the metal gate 702 and the remaining portion of high-k structure 704 from the ninth step, as shown in FIG. 10B. The deposition of the oxide spacer structure 1000 is performed by any suitable approach including chemical vapor deposition, atomic layer deposition, and/or a combination thereof. The oxide spacer structure 1000 can be made of the same material as the buried oxide layer 101. Following the formation of the oxide spacer structure 1000, formation of metal contact for the source and drain is performed, as shown in FIG. 10B. The deposition of the metal contact structure 1001 can be performed by any suitable approach including chemical vapor deposition, atomic layer deposition, and/or a combination thereof. The metal contact structure 1001 can be made of the material including copper (Cu) and tungsten (W).

Some embodiments of the present invention may include one, or more, of the following features, characteristics and/or advantages: (i) trim gate last to remove a portion of high-k and a portion of work function metal which is the source of parasitic resistance and capacitance; and/or (ii) allow a low parasitic capacitance without a conventional spacer process.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

Present invention: should not be taken as an absolute indication that the subject matter described by the term "present invention" is covered by either the claims as they are filed, or by the claims that may eventually issue after patent prosecution; while the term "present invention" is used to help the reader to get a general feel for which disclosures herein that are believed as maybe being new, this understanding, as indicated by use of the term "present invention," is tentative and provisional and subject to change over the course of patent prosecution as relevant information is developed and as the claims are potentially amended.

Embodiment: see definition of "present invention" above—similar cautions apply to the term "embodiment."

and/or: inclusive or; for example, A, B "and/or" C means that at least one of A or B or C is true and applicable.

What is claimed is:

1. A method for fabricating a fin MOSFET with substantially reduced parasitic capacitance and resistance, comprising:

patterning a fin structure on a substrate, the substrate including a first semiconductor layer;

patterning a dummy gate structure covering a first portion of the fin structure;

growing an epitaxy layer covering the substrate and a second portion of the fin structure, the second portion of the fin structure not being covered with the dummy gate structure and the second portion of the fin structure being doped to be integrated with the epitaxy layer, wherein a source and drain region is formed in the epitaxy layer;

depositing an oxide layer covering the epitaxy layer, a topmost surface of the oxide layer being planarized to be level with a topmost surface of the dummy gate structure;

removing the dummy gate structure to form a gate trench structure;

undercutting the epitaxy layer under the oxide layer along sidewalls of the gate trench structure to form an undercut structure;

forming a metal gate high-k structure by filling the undercut structure and a remaining portion of the gate trench structure with a high-k dielectric material and a metal gate material, a first portion of the metal gate high-k structure that fills the remaining portion of the gate trench structure being removed to form a nitride structure in the remaining portion of the gate trench structure;

removing the oxide layer to expose the metal gate high-k structure and the epitaxy layer;

removing a second portion of the metal gate high-k structure, the second portion of the metal gate high-k structure being not directly under the nitride structure;

forming an oxide spacer structure by depositing an oxide material into a void formed by removal of the second portion of the metal gate high-k structure; and forming a metal contact structure for the source and drain region.

2. The method of claim 1, wherein the substrate further includes an insulator layer covering the first semiconductor layer.

3. The method of claim 2, wherein the fin structure further covers a portion of the insulator layer.

4. The method of claim 2, wherein the substrate further includes a second semiconductor layer covering the insulator layer.

5. The method of claim 4, wherein the second semiconductor layer is made of any semiconductor material including silicon, an III-V compound, and an II-IV compound.

6. The method of claim 1, wherein the fin structure is covered with a thin oxide layer having a thickness ranging from about 1 nm to 2 nm.

7. The method of claim 6, wherein the step of removing the dummy gate structure to form a gate trench structure includes removing the thin oxide layer directly under the dummy gate structure.

8. The method of claim 1, wherein the fin structure has a fin height of about 30 nm.

9. The method of claim 1, wherein the dummy gate structure has a gate height of about 50 nm.

10. The method of claim 1, wherein the dummy gate structure is made of nitride.

11. The method of claim 1, wherein the epitaxy layer is formed by employing a non-faceted selective epitaxial growth.

12. The method of claim 1, wherein the epitaxy layer is made of material including one of silicon-germanium (SiGe) and indium arsenide (InAs), the epitaxy layer having a thickness of about 10 nm and a topmost surface less than a topmost surface of the dummy gate structure.

13. The method of claim 1, wherein the width of the undercut structure on each side of the gate trench structure is about 10 nm.

14. The method of claim 1, wherein the high-k dielectric material includes hafnium silicon oxynitride (HfSiON).

15. The method of claim 1, wherein the metal gate material includes titanium (Ta), titanium nitride (TaN), niobium (Nb), and tungsten nitride/ruthenium oxide (WN/RuO2).

16. The method of claim 1, wherein the metal contact structure is be made of a material including copper (Cu) and tungsten (W).

* * * * *